(12) United States Patent
Joshi

(10) Patent No.: US 9,131,631 B2
(45) Date of Patent: Sep. 8, 2015

(54) JET IMPINGEMENT COOLING APPARATUSES HAVING ENHANCED HEAT TRANSFER ASSEMBLIES

(71) Applicant: Toyota Motor Engineering & Manufacturing North America, Inc., Erlanger, KY (US)

(72) Inventor: Shailesh N. Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 219 days.

(21) Appl. No.: 13/962,303

(22) Filed: Aug. 8, 2013

(65) Prior Publication Data

US 2015/0043164 A1 Feb. 12, 2015

(51) Int. Cl.
*H05K 7/20* (2006.01)
*G06F 1/20* (2006.01)
(Continued)

(52) U.S. Cl.
CPC .............. *H05K 7/20936* (2013.01); *G06F 1/20* (2013.01); *H01L 23/34* (2013.01); *H01L 23/4735* (2013.01)

(58) Field of Classification Search
CPC . H05K 7/20; H05K 7/20309; H05K 7/20936; G06F 1/20; H01L 23/34; H01L 23/473; H01L 23/4735; F28F 3/02; F28F 3/08; F28F 3/14; F28F 7/00; B23P 15/26
USPC .............. 361/679.46, 679.53, 689, 698, 699, 361/702–712, 715, 719, 721, 724; 165/80.2, 80.4, 80.5, 104.33, 104.34, 165/104.26, 185, 166, 908; 257/706–726; 174/15.1, 16.1, 16.3; 62/259.2
See application file for complete search history.

(56) References Cited

U.S. PATENT DOCUMENTS

| 4,201,195 A | 5/1980 | Sakhuja |
| 4,322,737 A | 3/1982 | Sliwa, Jr. et al. |
| 4,392,153 A | 7/1983 | Glascock, II et al. |

(Continued)

FOREIGN PATENT DOCUMENTS

| JP | 10121110 | 5/1998 |
| WO | 98/44307 | 10/1998 |
| WO | WO2005029555 | 3/2005 |

OTHER PUBLICATIONS

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

(Continued)

*Primary Examiner* — Michail V Datskovskiy
(74) *Attorney, Agent, or Firm* — Dinsmore & Shohl LLP

(57) ABSTRACT

Enhanced heat transfer assemblies and jet impingement cooling apparatuses having target surfaces with surface fins and microslots are disclosed. In one embodiment, an enhanced heat transfer assembly includes a target surface, a plurality of surface fins extending from the target surface, and a plurality of microslot matrices formed on the target surface. Each microslot matrix includes individual microslots positioned adjacent to each other, and each microslot matrix is adjacent to a jet impingement zone and at least one of the plurality of surface fins. Jet impingement cooling apparatuses and power electronics modules having an enhanced heat transfer assembly with surface fins and matrices of microslots are also disclosed.

20 Claims, 8 Drawing Sheets

(51) Int. Cl.
*H01L 23/473* (2006.01)
*H01L 23/34* (2006.01)

(56) References Cited

U.S. PATENT DOCUMENTS

| | | | |
|---|---|---|---|
| 4,420,739 A | 12/1983 | Herren | |
| 4,494,171 A | 1/1985 | Bland et al. | |
| 4,583,582 A | 4/1986 | Grossman | |
| 4,733,293 A | 3/1988 | Gabuzda | |
| 4,748,495 A | 5/1988 | Kucharek | |
| 4,783,721 A | 11/1988 | Yamamoto et al. | |
| 4,868,712 A | 9/1989 | Woodman | |
| 4,920,574 A | 4/1990 | Yamamoto et al. | |
| 4,956,746 A | 9/1990 | Gates, Jr. et al. | |
| 5,016,138 A | 5/1991 | Woodman | |
| 5,023,695 A * | 6/1991 | Umezawa et al. | 257/714 |
| 5,067,047 A | 11/1991 | Azar | |
| 5,079,619 A | 1/1992 | Davidson | |
| 5,088,005 A | 2/1992 | Ciaccio | |
| 5,119,175 A | 6/1992 | Long et al. | |
| 5,145,001 A | 9/1992 | Valenzuela | |
| 5,210,440 A | 5/1993 | Long | |
| 5,228,502 A | 7/1993 | Chu et al. | |
| 5,260,850 A | 11/1993 | Sherwood et al. | |
| 5,263,536 A * | 11/1993 | Hulburd et al. | 165/80.4 |
| 5,269,372 A | 12/1993 | Chu et al. | |
| 5,270,572 A | 12/1993 | Nakajima et al. | |
| 5,310,440 A | 5/1994 | Zingher | |
| 5,316,075 A | 5/1994 | Ouon et al. | |
| 5,353,865 A * | 10/1994 | Adiutori et al. | 165/133 |
| 5,365,400 A | 11/1994 | Ashiwake et al. | |
| 5,394,299 A | 2/1995 | Chu et al. | |
| 5,402,004 A | 3/1995 | Ozmat | |
| 5,546,274 A | 8/1996 | Davidson | |
| 5,548,907 A | 8/1996 | Gourdine | |
| 5,912,800 A | 6/1999 | Sammakia et al. | |
| 5,959,351 A | 9/1999 | Sasaki et al. | |
| 5,978,220 A | 11/1999 | Frey et al. | |
| 5,983,997 A | 11/1999 | Hou | |
| 6,058,010 A | 5/2000 | Schmidt et al. | |
| 6,084,771 A | 7/2000 | Ranchy et al. | |
| 6,123,145 A | 9/2000 | Giezer et al. | |
| 6,152,215 A | 11/2000 | Niggemann | |
| 6,167,948 B1 | 1/2001 | Thomas | |
| 6,167,952 B1 | 1/2001 | Downing | |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,349,554 B2 | 2/2002 | Patel et al. | |
| 6,377,461 B1 | 4/2002 | Ozmat et al. | |
| 6,386,278 B1 | 5/2002 | Schulz-Harder | |
| 6,431,260 B1 | 8/2002 | Agonafer et al. | |
| 6,459,581 B1 | 10/2002 | Newton et al. | |
| 6,501,654 B2 | 12/2002 | O'Connor et al. | |
| 6,519,151 B2 * | 2/2003 | Chu et al. | 361/699 |
| 6,580,609 B2 | 6/2003 | Pautsch | |
| 6,609,560 B2 | 8/2003 | Cho et al. | |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 * | 10/2005 | Tilton et al. | 361/699 |
| 6,972,365 B2 | 12/2005 | Garner | |
| 6,986,382 B2 | 1/2006 | Upadhya et al. | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,009,842 B2 | 3/2006 | Tilton et al. | |
| 7,017,654 B2 | 3/2006 | Kenny et al. | |
| 7,035,104 B2 | 4/2006 | Meyer | |
| 7,058,101 B2 | 6/2006 | Treusch et al. | |
| 7,071,408 B2 | 7/2006 | Garner | |
| 7,104,312 B2 * | 9/2006 | Goodson et al. | 165/80.4 |
| 7,114,550 B2 | 10/2006 | Nakahama et al. | |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,206,203 B2 | 4/2007 | Campbell et al. | |
| 7,212,409 B1 | 5/2007 | Belady et al. | |
| 7,213,636 B2 * | 5/2007 | Bhatti et al. | 165/80.4 |
| 7,233,494 B2 | 6/2007 | Campbell et al. | |
| 7,250,674 B2 | 7/2007 | Inoue | |
| 7,277,283 B2 | 10/2007 | Campbell et al. | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,301,772 B2 | 11/2007 | Tilton et al. | |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,375,962 B2 | 5/2008 | Campbell et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,843 B2 | 8/2008 | Joshi et al. | |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,511,957 B2 | 3/2009 | Campbell et al. | |
| 7,514,046 B2 | 4/2009 | Kechagia et al. | |
| 7,516,776 B2 | 4/2009 | Bezama et al. | |
| 7,530,778 B2 | 5/2009 | Yassour et al. | |
| 7,551,439 B2 | 6/2009 | Peugh et al. | |
| 7,571,618 B2 | 8/2009 | Dessiatoun | |
| 7,597,135 B2 * | 10/2009 | Ghosh et al. | 165/80.4 |
| 7,599,184 B2 | 10/2009 | Upadhya et al. | |
| 7,608,924 B2 | 10/2009 | Myers et al. | |
| 7,639,030 B2 | 12/2009 | Wadell | |
| 7,679,911 B2 | 3/2010 | Rapp | |
| 7,738,249 B2 | 6/2010 | Chan et al. | |
| 7,762,314 B2 * | 7/2010 | Campbell et al. | 165/80.3 |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,835,151 B2 | 11/2010 | Olesen | |
| 7,836,694 B2 | 11/2010 | Arnold | |
| 7,839,642 B2 | 11/2010 | Martin | |
| 7,841,843 B2 | 11/2010 | Cho et al. | |
| 7,885,074 B2 | 2/2011 | Campbell et al. | |
| 7,916,483 B2 | 3/2011 | Campbell et al. | |
| 7,921,664 B2 | 4/2011 | Rini et al. | |
| 7,940,526 B2 | 5/2011 | Shulz-Harder et al. | |
| 7,942,997 B2 | 5/2011 | Rivas et al. | |
| 7,952,875 B2 | 5/2011 | Woody et al. | |
| 7,992,627 B2 | 8/2011 | Bezama et al. | |
| 8,037,927 B2 | 10/2011 | Schuette | |
| 8,059,405 B2 | 11/2011 | Campbell et al. | |
| 8,074,706 B2 | 12/2011 | Su et al. | |
| 8,077,460 B1 | 12/2011 | Dede et al. | |
| 8,081,461 B2 | 12/2011 | Campbell et al. | |
| 8,118,084 B2 | 2/2012 | Harvey | |
| 8,169,779 B2 * | 5/2012 | Le et al. | 361/689 |
| 8,194,406 B2 | 6/2012 | Campbell et al. | |
| 8,199,505 B2 | 6/2012 | Dede | |
| 8,243,451 B2 | 8/2012 | Dede et al. | |
| 8,266,802 B2 | 9/2012 | Campbell et al. | |
| 8,391,008 B2 | 3/2013 | Dede | |
| 8,643,173 B1 * | 2/2014 | Rau et al. | 257/714 |
| 8,659,896 B2 * | 2/2014 | Dede et al. | 361/699 |
| 8,786,078 B1 * | 7/2014 | Rau et al. | 257/714 |
| 8,944,151 B2 * | 2/2015 | Flotta et al. | 165/104.21 |
| 8,981,556 B2 * | 3/2015 | Joshi | 257/714 |
| 2002/0053726 A1 | 5/2002 | Mikubo et al. | |
| 2002/0079088 A1 | 6/2002 | Agonafer et al. | |
| 2003/0150599 A1 | 8/2003 | Suzuki | |
| 2003/0196451 A1 | 10/2003 | Goldman et al. | |

(56) References Cited

U.S. PATENT DOCUMENTS

| | | |
|---|---|---|
| 2004/0206477 A1 | 10/2004 | Kenny et al. |
| 2005/0041393 A1 | 2/2005 | Tustaniwskyi et al. |
| 2005/0121180 A1 | 6/2005 | Marsala |
| 2005/0168947 A1 | 8/2005 | Mok et al. |
| 2005/0199372 A1 | 9/2005 | Frazer et al. |
| 2005/0225938 A1 | 10/2005 | Montgomery et al. |
| 2005/0230085 A1 | 10/2005 | Valenzuela |
| 2006/0002086 A1 | 1/2006 | Teneketges et al. |
| 2006/0002087 A1 | 1/2006 | Bezama et al. |
| 2006/0144565 A1 | 7/2006 | Tsai et al. |
| 2006/0162365 A1 | 7/2006 | Hoang et al. |
| 2006/0266498 A1 | 11/2006 | Liu et al. |
| 2006/0291164 A1 | 12/2006 | Myers et al. |
| 2007/0034360 A1 | 2/2007 | Hall |
| 2007/0041160 A1 | 2/2007 | Kehret et al. |
| 2007/0074856 A1 | 4/2007 | Bhatti et al. |
| 2007/0084587 A1 | 4/2007 | Huang et al. |
| 2007/0114656 A1 | 5/2007 | Brandenburg et al. |
| 2007/0119565 A1 | 5/2007 | Brunschwiler et al. |
| 2007/0177352 A1 | 8/2007 | Monfarad et al. |
| 2007/0188991 A1 | 8/2007 | Wilson et al. |
| 2007/0221364 A1 | 9/2007 | Lai et al. |
| 2007/0230127 A1 | 10/2007 | Peugh et al. |
| 2007/0236883 A1 | 10/2007 | Ruiz |
| 2007/0272392 A1* | 11/2007 | Ghosh et al. ............... 165/80.4 |
| 2007/0274045 A1 | 11/2007 | Campbell et al. |
| 2007/0295480 A1 | 12/2007 | Campbell et al. |
| 2008/0093053 A1 | 4/2008 | Song et al. |
| 2008/0169087 A1 | 7/2008 | Downing |
| 2008/0245506 A1 | 10/2008 | Campbell et al. |
| 2008/0264604 A1 | 10/2008 | Campbell et al. |
| 2009/0032937 A1 | 2/2009 | Mann et al. |
| 2009/0090490 A1 | 4/2009 | Yoshida et al. |
| 2009/0108439 A1 | 4/2009 | Brandenburg et al. |
| 2009/0213546 A1 | 8/2009 | Hassani et al. |
| 2009/0294106 A1 | 12/2009 | Flotta et al. |
| 2010/0000766 A1 | 1/2010 | Loiselet et al. |
| 2010/0038774 A1 | 2/2010 | Zhang et al. |
| 2010/0044018 A1 | 2/2010 | Fuberg et al. |
| 2010/0097760 A1 | 4/2010 | Azar et al. |
| 2010/0134996 A1 | 6/2010 | Loiselet et al. |
| 2010/0142150 A1* | 6/2010 | Campbell et al. ............. 361/702 |
| 2010/0242178 A1 | 9/2010 | Goetting |
| 2010/0246117 A1 | 9/2010 | Brunschwiler et al. |
| 2010/0277868 A1 | 11/2010 | Beaupre et al. |
| 2011/0141690 A1 | 6/2011 | Le et al. |
| 2011/0146955 A1 | 6/2011 | Chen |
| 2011/0216502 A1 | 9/2011 | Dede |
| 2011/0272120 A1 | 11/2011 | Joshi et al. |
| 2012/0048515 A1 | 3/2012 | Bhunia et al. |
| 2012/0063091 A1 | 3/2012 | Dede et al. |
| 2012/0097368 A1 | 4/2012 | Chen et al. |
| 2012/0168145 A1 | 7/2012 | Peterson et al. |
| 2012/0170222 A1 | 7/2012 | Dede |
| 2012/0181005 A1 | 7/2012 | Downing |
| 2012/0212907 A1 | 8/2012 | Dede |
| 2012/0257354 A1 | 10/2012 | Dede |
| 2012/0279684 A1 | 11/2012 | Keisling et al. |
| 2013/0020059 A1 | 1/2013 | Park |

OTHER PUBLICATIONS

Brignoni, L., Garimella, S., "Performance Characteristics of Confined Impinging Air Jets with Surface Enhancement," Advances in Electronic Packaging, vol. 26-2, 1999: 2009-2014.

Brunschwiler, T., H. Rothuizen, M. Fabbri, U. Kloter, B. Michel, R.J. Benzama, and G. Natarajan, "Direct Liquid Jet-Impingrnent Cooling With Micron-Sized Nozzle Array and Distributed Return Architecture"; Proc. Of The Tenth Intersociety Conference on Thermal and Thermomechanical Phenomena in Electronics Systems, San Diego, CA, 2006: 196-203.

El-Sheikh, H., Garimella, S., "Heat Transfer from Pin-Fin Heat Sinks under Multiple Impinging Jets," IEEE Transactions on Advanced Packaging, vol. 23-1, 2000: 113-120.

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-3839.

Skuriat, Robert, Optimum Cooling Solutions for Power Electronics, Nottingham University, Jul. 4, 2008.

Wadsworth, D.C., Mudawar, I., Cooling of a Multichip Electronic Module by Means of Confined Two-Dimensional Jets of Dielectric Liquid, Journal of Heat Transfer, Nov. 1990, vol. 112.

Arslan, Selin, "Micro-Evaporator Design and Investigation of Phase Change in Tailored Microchannels", Columbia University, 2011.

J.P. Li, et al., Porous Ti6Al4V scaffold directly fabricating by rapid prototyping: Preparation and in vitro experiment; Science Direct; Biomaterials 27 (2006) 1223-1235.

U.S. Appl. No. 13/734,710, filed Jan. 4, 2013, titled: "Cooling Apparatuses and Power Electronics Modules With Single-Phase and Two-Phase Surface Enhancement Features"; Notice of Allowance issued Oct. 2, 2013.

U.S. Appl. No. 13/683,660, filed Nov. 21, 2012, titled: "Cooling Apparatuses Having Sloped Vapor Outlet Channels".

U.S. Appl. No. 13/734,615, filed Jan. 4, 2013, titled: "Modular Jet Impingement Cooling Apparatuses With Exchangeable Jet Plates".

U.S. Appl. No. 13/734,635, filed Jan. 4, 2013, titled: "Cooling Apparatuses Having A Jet Orifice Surface With Alternating Vapor Guide Channels".

U.S. Appl. No. 13/847,186, filed Mar. 19, 2013, titled: "Jet Impingement Cooling Apparatuses Having Non-Uniform Jet Orifice Sizes".

U.S. Appl. No. 13/935,686, filed Jul. 5, 2013, titled: "Cooling Assemblies and Power Electronics Modules Having Multiple-Porosity Structures".

U.S. Appl. No. 13/935,800, filed Jul. 5, 2013, titled: "Cooling Apparatuses Having Porous Three Dimensional Surfaces".

* cited by examiner

JET IMPINGEMENT COOLING APPARATUSES HAVING ENHANCED HEAT TRANSFER ASSEMBLIES

TECHNICAL FIELD

The present specification generally relates to cooling apparatuses for cooling heat generating devices and, more particularly, to jet impingement cooling apparatuses having enhanced heat transfer assemblies.

BACKGROUND

Heat generating devices, such as power semiconductor devices, may be coupled to a heat spreader to remove heat and lower the maximum operating temperature of the heat generating device, in some applications, cooling fluid may be used to receive heat generated by the heat generating device via convective thermal transfer, and to remove such heat from the heat generating device. For example, jet impingement may be used to cool a heat generating device by directing impingement jets of coolant fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor. However, in two-phase cooling, stagnant coolant fluid at the target surface that does not change to vapor may adversely affect heat transfer performance.

Accordingly, a need exists for alternative jet impingement cooling apparatuses with increased surface area and/or nucleation sites.

SUMMARY

In one embodiment, an enhanced heat transfer assembly includes a target surface, a plurality of surface fins extending from the target surface, and a plurality of distinct microslot matrices formed on the target surface. Each microslot matrix includes individual microslots positioned adjacent to each other, and each microslot matrix is adjacent to a jet impingement zone and at least one of the plurality of surface fins.

In another embodiment, a cooling apparatus includes a fluid inlet channel, a fluid outlet channel, a jet orifice surface including a plurality of jet orifices fluidly coupled to the fluid inlet channel such that coolant fluid within the fluid inlet channel is capable of flowing through the plurality of jet orifices as a plurality of impingement jets, and an enhanced heat transfer assembly with a target surface. The target surface includes a plurality of surface fins, a plurality of microslot matrices including individual microslots, and a plurality of jet impingement zones on the target surface. Each individual microslot matrix is separated by at least one of the plurality of jet impingement zones and individual matrices. Individual jet impingement zones are disposed between adjacent surface fins and the target surface and the jet orifice surface define an impingement chamber. The plurality of impingement jets are substantially aligned with the plurality of jet impingement zones.

In yet another embodiment, a power electronics module includes a fluid inlet channel, a fluid outlet channel, a jet orifice surface including a plurality of jet orifices fluidly coupled to the fluid inlet channel such that coolant fluid within the fluid inlet channel is capable of flowing through the plurality of jet orifices as a plurality of impingement jets, and a heat transfer assembly including a target surface and a heat transfer surface. The power electronics module further includes a power electronics device thermally coupled to the heat transfer surface of the heat transfer assembly, wherein the target surface includes a plurality of surface fins, a plurality of microslot matrices including individual microslots, and a plurality of jet impingement zones on the target surface. Each individual microslot matrix is separated by at least one of the plurality of jet impingement zones and individual matrices and individual jet impingement zones are disposed between adjacent surface fins. The target surface and the jet orifice surface define an impingement chamber, and the plurality of impingement jets are substantially aligned with the plurality of jet impingement zones.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to enhanced heat transfer assemblies and jet impingement cooling apparatuses that may be utilized to cool heat generating devices, such as semiconductor devices. In the embodiments described herein, jet impingement is provided by directing jets of coolant fluid at an impingement region of a target surface, which may be a thermally conductive target plate coupled to a heat generating device. Heat is transferred to the coolant fluid as it flows over the target surface. Upon impinging the target surface, some of the coolant fluid changes phase from a liquid to a vapor thereby further removing heat flux from the heat generating device. Accordingly, embodiments are directed to two-phase, jet impingement cooling devices.

Embodiments described herein may provide for enhanced heat transfer and efficient phase change of coolant fluid. As described in more detail below, coolant fluid impinges the target surface to provide heat transfer. Upon impacting the target surface, heat is transferred to the coolant fluid and some of the coolant fluid changes phase from liquid to vapor. The coolant fluid may change phase from liquid to vapor at nucleation sites located on the target surface. However, the coolant fluid may not efficiently change phase on a smooth surface with limited nucleation sites. Embodiments described herein have enhanced heat transfer assemblies including target surfaces with surface fins and matrices of microslots. The surface fins increase the surface area of the target surface to thereby increase the transfer of heat to the coolant fluid by convective heat transfer. Due to their small size, the matrices of microslots provide additional nucleation sites that are available for boiling the coolant fluid that impinges the target surface. For example, phase change of the coolant fluid may occur at additional nucleation sites provided along the base of the microslots. Various embodiments of cooling apparatuses having enhanced heat transfer assemblies to provide improved heat transfer and additional nucleation sites at the target surface are described in detail below.

Figure 1:
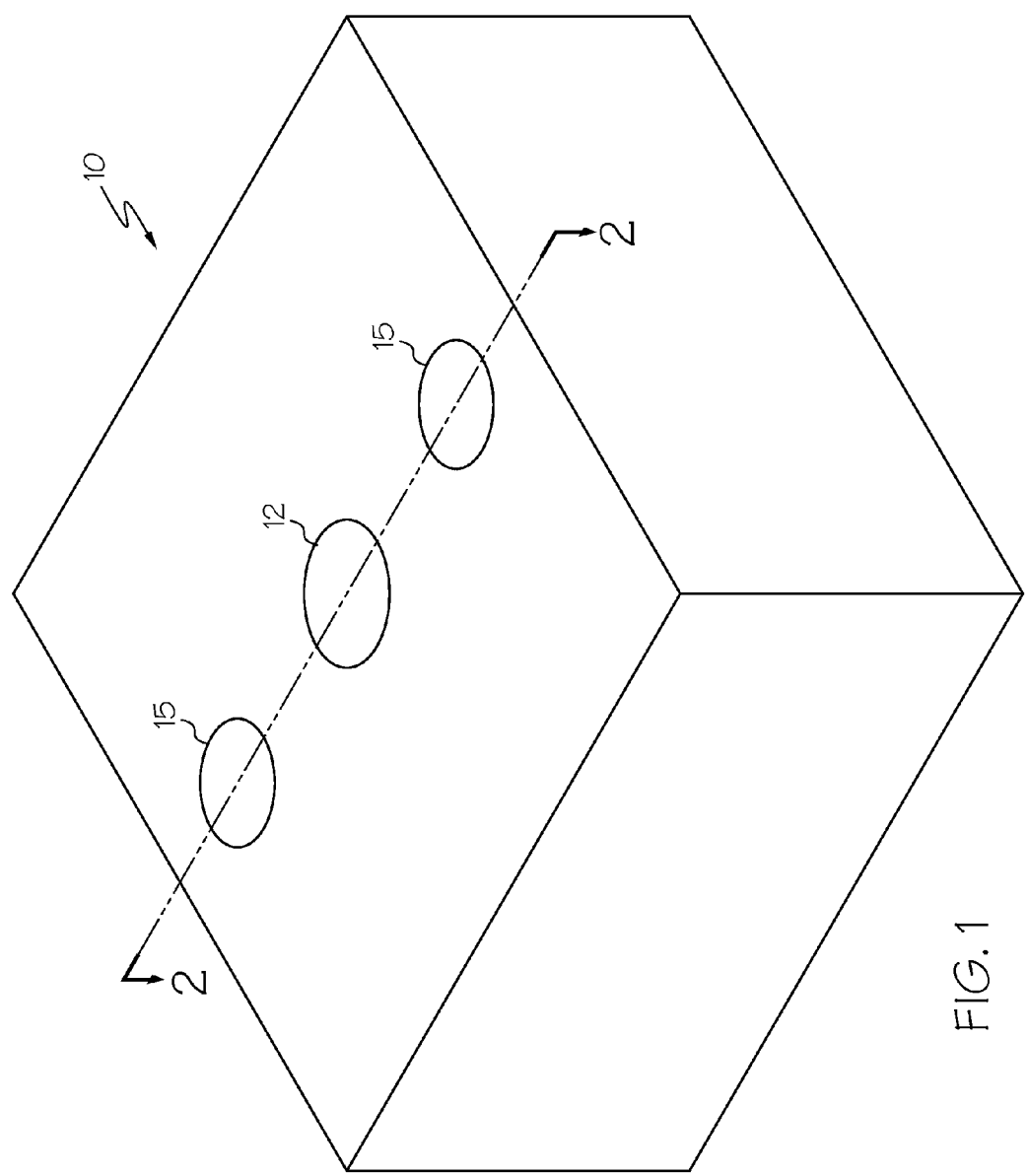
FIG. 1 schematically depicts a perspective view of a jet impingement, two-phase cooling apparatus according to one or more embodiments described and illustrated herein.

Referring now to FIG. 1, an example jet impingement cooling apparatus 10 is schematically depicted. The cooling apparatus 10 generally includes a fluid inlet 12 and several fluid outlets 15. The fluid inlet 12 and the fluid outlets 15 may be fluidly coupled to fluid lines (not shown) that are fluidly coupled to a coolant fluid reservoir (not shown). The coolant fluid may be any appropriate liquid, such as deionized water or radiator fluid, for example. The schematically depicted fluid inlet 12 and the fluid outlets 15 may be configured as couplings, such as male or female fluid couplings, for connecting fluid lines to the fluid inlet 12 and the fluid outlets 15. Coolant fluid flows through fluid inlet 12 and into the cooling apparatus 10, as described below. After flowing into the cooling apparatus 10, the coolant fluid may contact a heat transfer assembly and change phase from liquid, to vapor due to heat transfer from the heat transfer assembly to the coolant fluid. The coolant fluid may flow out from the cooling apparatus 10 in vapor form through fluid outlets 15, as will be discussed in detail herein. Embodiments may have any number of fluid inlets and fluid outlets. Further, although the fluid, inlet 12 is shown in between the fluid outlets 15 in linear form in FIG. 1, the fluid outlets 15 may be otherwise positioned, such as surrounding the fluid inlet 12 in a circular manner. The fluid inlet 12 and outlets 15 may also take on different shapes, although shown as circular in the illustrated embodiment.

Figure 2:
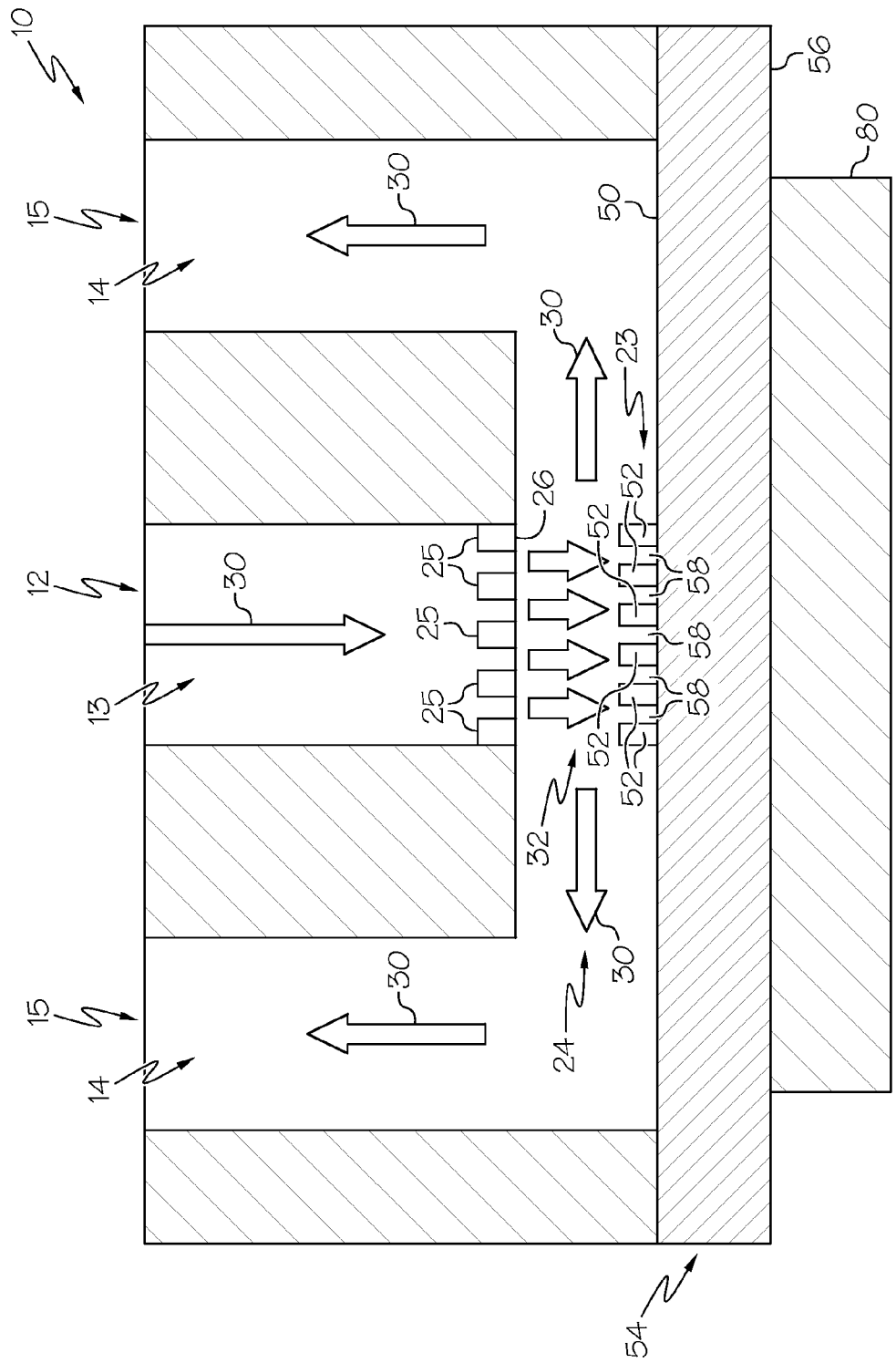
FIG. 2 schematically depicts a cross sectional view of the jet impingement, two-phase cooling apparatus of FIG. 1 according to one or more embodiments described and illustrated herein.

Referring now to FIG. 2, the exemplary jet impingement cooling apparatus 10 is schematically depicted in cross section along line 2-2 of FIG. 1 according to one embodiment. The fluid inlet 12 is fluidly coupled to a fluid inlet channel 13 and several fluid outlet channels 14 that are fluidly coupled to the one or more fluid outlets 15. In some embodiments, the fluid outlet channels 14 may converge to a single fluid outlet, and/or exit one or more sides of the cooling apparatus 10 rather than the top as depicted in FIGS. 1 and 2. In other embodiments, only one fluid outlet 15 is provided.

Figure 3:
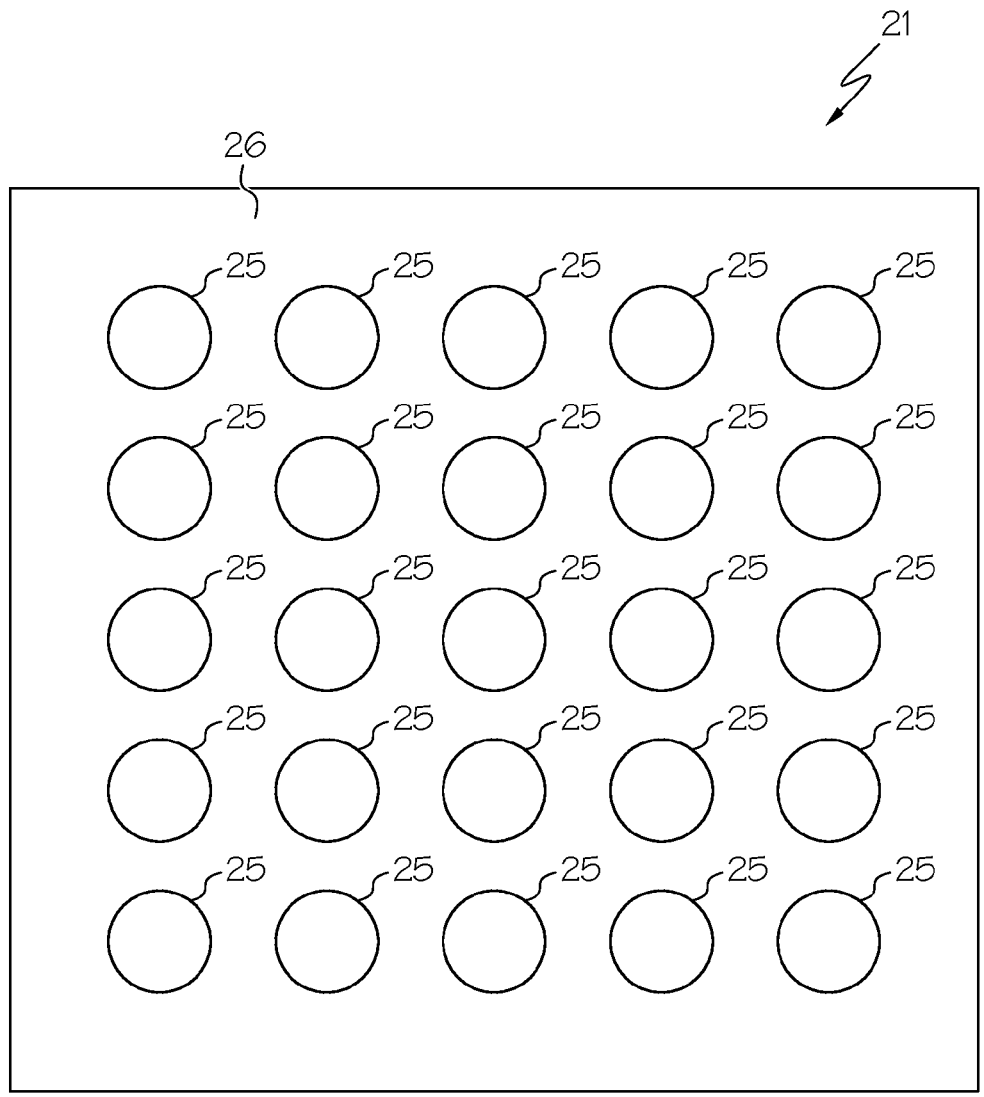
FIG. 3 schematically depicts a top view of a jet orifice plate according to one or more embodiments described and illustrated herein.

The fluid inlet channel 13 terminates at a jet orifice plate 21 having a jet orifice surface 26. FIG. 3 depicts a jet plate 21 according to one embodiment. The jet orifice surface 26 includes a plurality of jet orifices 25. In the illustrated embodiment, the jet orifices 25 are of uniform diameter and are of circular shape. The jet orifices 25 are also aligned in an array pattern. Although shown in the embodiment of FIG. 3 as a 5×5 array of jet orifices, additional or fewer jet orifices may be included, and patterns other than an array, such as circular, helical, or elliptical patterns may be used. Further, in other embodiments, the jet orifices may have varying diameters, which may allow for modified coolant fluid velocity. Other embodiments may also include jet orifices of different geometry, including rectangular, elliptical, triangular, or other shapes.

Referring again to FIG. 2, coolant fluid 30 flows through the fluid inlet channel 13 and the array of jet orifices 25. The coolant fluid 30 exits the jet orifices 25 as impingement jets 32 that impinge a thermally conductive enhanced heat transfer assembly 54 comprising a target surface 50 that is thermally coupled to a heat generating device 80. (e.g., a semiconductor device) at an interface 56. The impingement jets 32 may be substantially normal with respect to the target surface 50 in some embodiments. It should be understood that more than one heat generating device 80 may be coupled to the interface 56 of the heat transfer assembly 54.

As described, in more detail below, the target surface 50 includes thermally conductive surface fins 52 and microslots to further enable heat transfer from the heat generating device to the coolant fluid. The target surface 50 may also be porous or covered in a porous material, which may further enhance heat transfer by providing additional nucleation sites. The target surface 50 may include other surface features as well, such as thermally conductive pins.

Heat generating devices 80 may include, but are not limited to, insulated gate bipolar transistors (IGBT), metal-oxide-semiconductor field, effect transistors (MOSFET), power diodes, power bipolar transistors, and power thyristor devices. As an example and not a limitation, the heat generating device 80 may be included in a power electronic module as a component in an inverter and/or converter circuit used to electrically power high load devices, such as electric motors in electrified vehicles (e.g., hybrid vehicles, plug in hybrid electric vehicles, plug in electric vehicles, and the like).

After impinging the target surface 50, which may be configured as a plate of thermally conductive material such as copper, tin, or aluminum, for example, the coolant fluid 30 flows away from a general impingement area 23 within an impingement chamber 24 defined by the target surface 50 and the jet orifice surface 26. Some of the coolant fluid 30 may change phase from a liquid to a vapor due to the high temperature heat generating device 80 being cooled.

Figure 4:
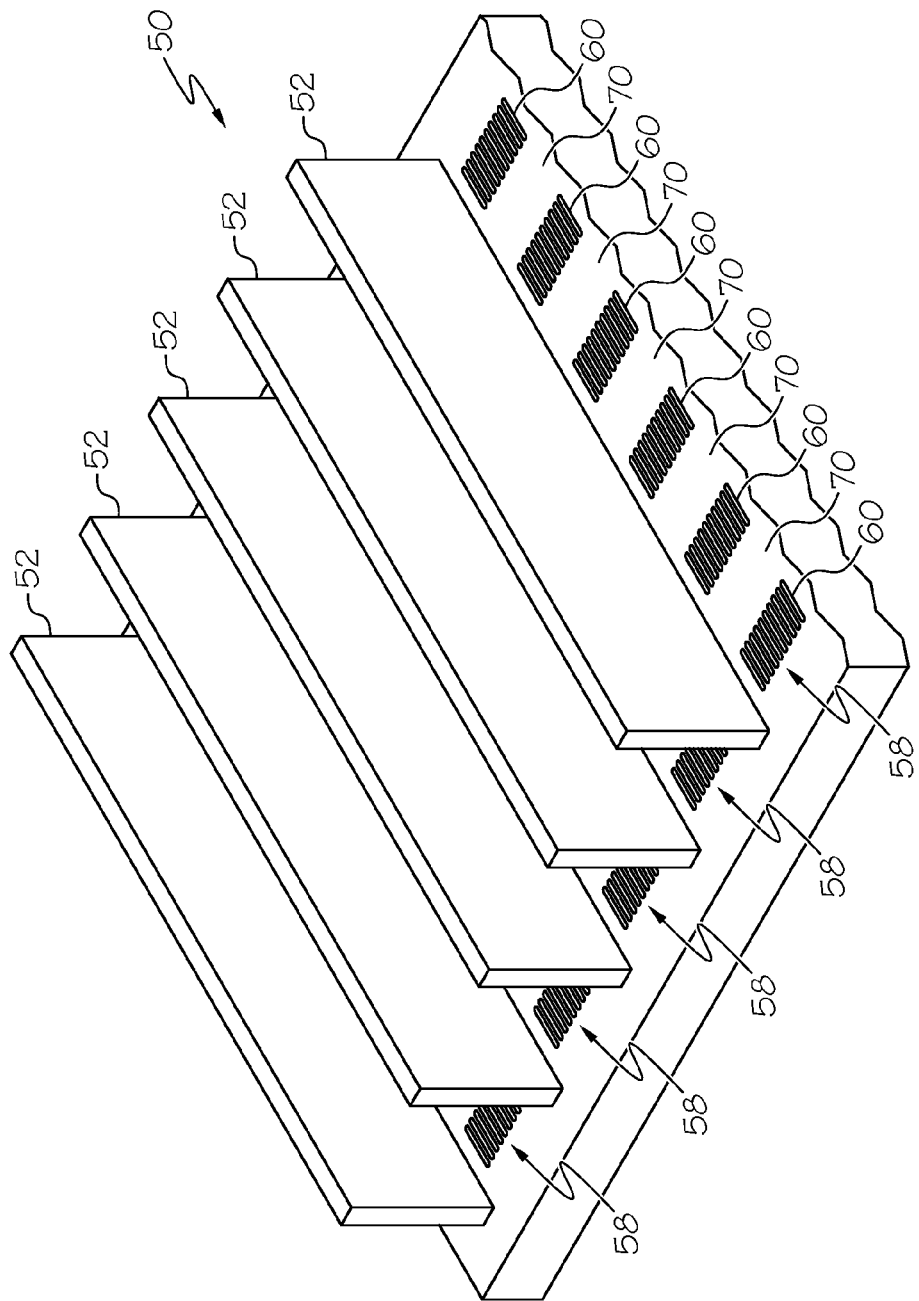
FIG. 4 schematically depicts a perspective view of a target surface of an enhanced heat transfer assembly for heat transfer according to one or more embodiments described and illustrated herein.
Figure 5:
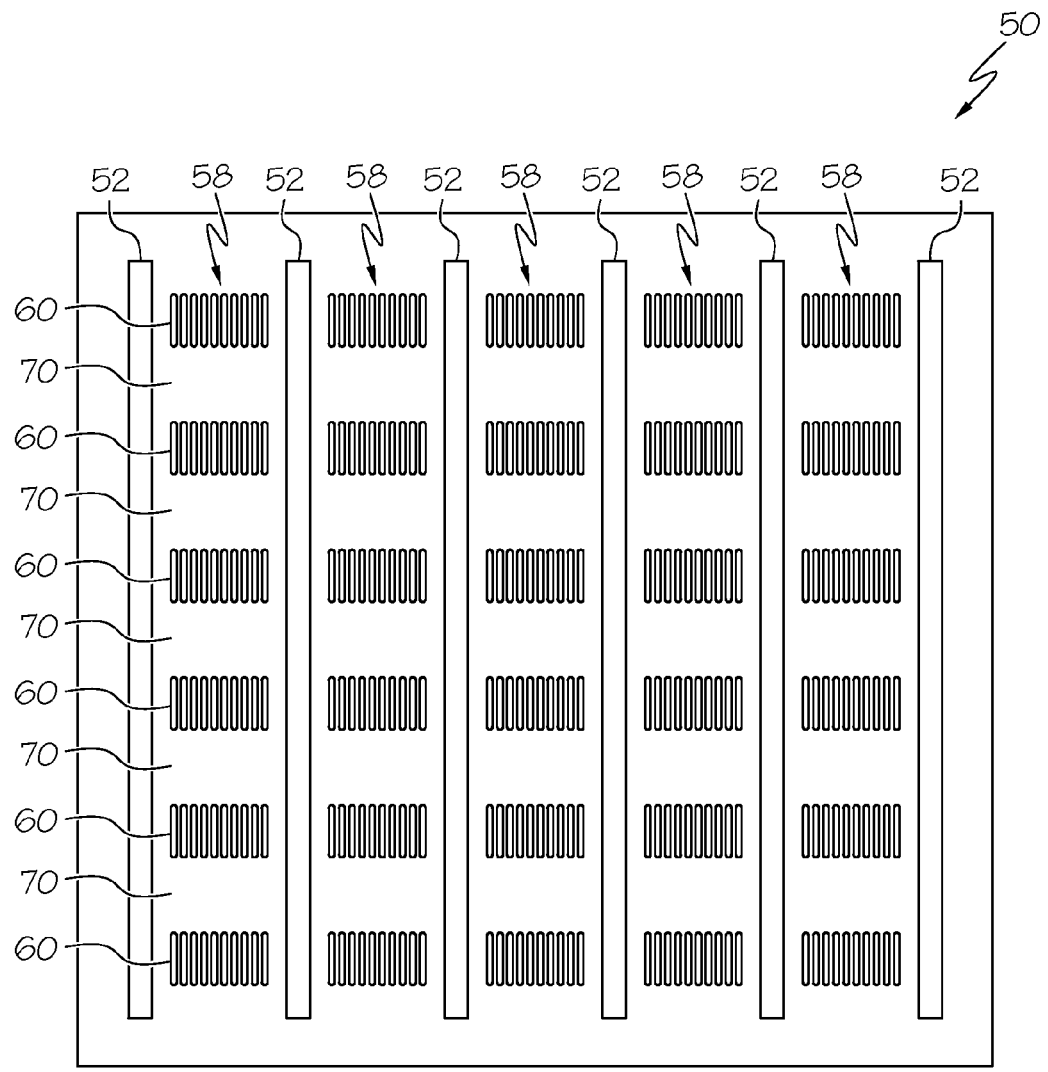
FIG. 5 schematically depicts a top view of the target surface of FIG. 4 according to one or more embodiments described and illustrated herein.

FIGS. 4 and 5 depict an exemplary target surface 50 including a plurality of thermally conductive surface fins 52 extending orthogonally from the target surface 50 and impingement regions 58 in perspective and top views, respectively. The impingement regions 58 include microslot matrices 60 and jet impingement zones 70. For ease of illustration, only one column (or row) of impingement regions 58 is numbered with microslot matrices 60 and jet impingement zones 70. The impingement jets 32 generally impinge the target surface 50 at impingement regions 58, or more specifically at the jet impingement zones 70 within the impingement regions 58, which are adjacent to surface fins 52.

The surface fins 52 are arranged between rows (or columns) of jet impingement regions 58. The surface fins 52 may assist in directing the coolant fluid 30 within the impingement chamber 24 shown in FIG. 2. The surface fins 52 may also enhance thermal transfer by providing additional heat transfer surface area. Although the surface fins 52 are shown as straight fins, other fins may be used, including curvilinear fins or other non-uniform fins. The surface fins 52 may be formed using an abrasive grinding or water jet machining process, an extrusion process, or may be bonded to the target surface. Other fabrication processes may also be used to form the surface fins. Additionally, other embodiments may include surface tins that are non-parallel or of varying dimensions. Pins or posts may also be used instead of or in addition to surface fins.

In the embodiment shown in FIGS. 4 and 5, the jet impingement zones 70 are positioned such that they are substantially aligned with the jet orifices 25 shown in FIG. 3. The jet impingement zones 70 generally indicate the portions of the target surface 50 that are initially impinged by the impingement jets 32. Upon impinging the jet impingement zones 70, the coolant fluid 30 may flow to the microslot matrices 60 positioned proximate to each jet impingement zone 70.

The microslot matrices 60 in the embodiment depicted in FIG. 5 are positioned adjacent to the jet impingement zones 70 on one side, and at least one surface fin 52 on another side. The microslot matrices 60 may be uniform across the target surface 50, or in other embodiments may be non-uniform. For example, the microslot matrices along a perimeter of the target surface may have different dimensions than microslot matrices within an interior portion of the target surface, which may affect coolant fluid flow direction and other fluid properties. Additionally, microslot matrices between jet impingement zones may have varying properties, such as geometry, angular configuration, or dimensions that may be dependent on the impact velocity of the coolant fluid at an adjacent jet impingement region. Although each microslot matrix 60 is shown as being, uniform in FIG. 5, other embodiments may further implement varying angles, geometry, and/or dimensions to achieve desired heat transfer performance, as described below.

In other embodiments, the layout of the jet impingement zones 70, surface fins 52, and microslot matrices 60 may be different from the layout depicted in FIGS. 4 and 5. The microslot matrices 60 may not be positioned adjacent to surface fins 52, or the microslot matrices 60 may be positioned within the jet impingement zones 70. Other embodiments may include microslot matrices positioned adjacent to other microslot matrices and/or jet impingement zones positioned adjacent to other jet impingement zones. Although the microslot matrices 60 are illustrated as being substantially parallel to the surface fins 52, in other embodiments the microslot matrices 60 may be, for example, perpendicular to the surface fins 52, or may have an angled configuration with respect to the surface fins 52. Further, the microslot matrices 60 may be configured as intersecting microslots forming a cross-hatch pattern). Additionally, other embodiments may include jet impingement zones or microslot matrices placed singularly without surface fins positioned adjacent thereto. In yet other embodiments, the target surface may include the jet impingement zones and microslot matrices in a circular, triangular, rectangular, or other pattern rather than in the array pattern shown in FIGS. 4 and 5. The exemplary target surface 50 shown in FIGS. 4 and 5 may be suited for a cooling apparatus having a 5×5 array of impingement jets, with each jet impinging a single jet impingement zone 70. Other embodiments may have various configurations with more or fewer impingement jets and the jet impingement zones on the target surface aligned with the impingement jets.

Figure 6:
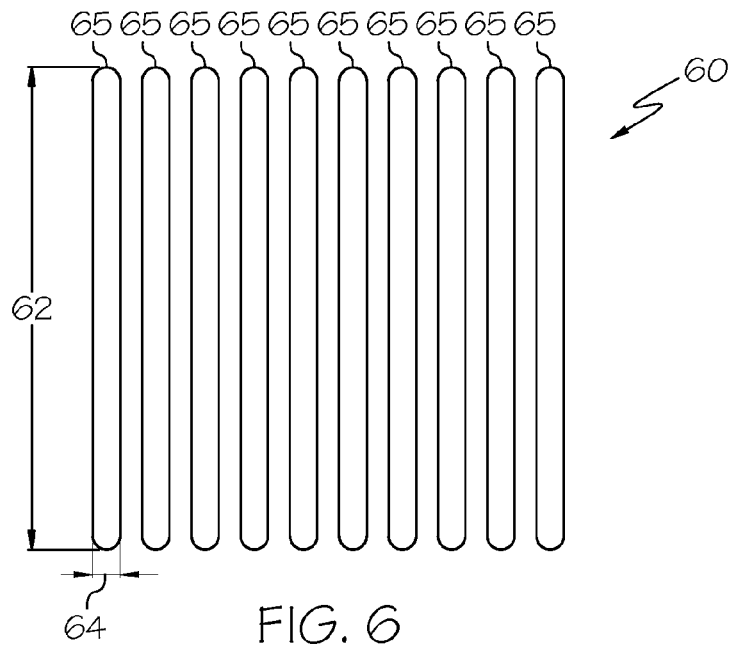
FIG. 6 schematically depicts a top view of a uniform microslot matrix positioned on the target surface of FIG. 4 according to one or more embodiments described and illustrated herein.
Figure 7:
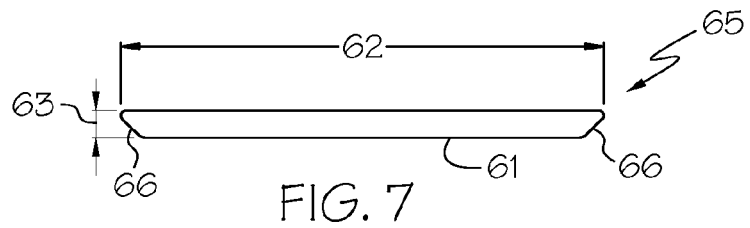
FIG. 7 schematically depicts a cross section view of an individual microslot according to one or more embodiments described and illustrated herein.
Figure 8:
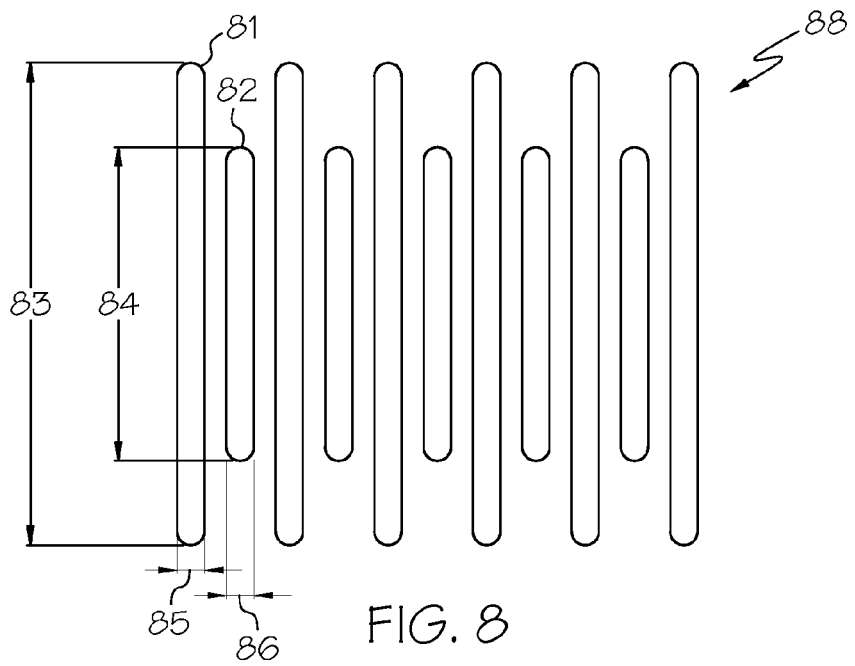
FIG. 8 schematically depicts a top view of a non-uniform microslot matrix according to one or more embodiments described and illustrated herein.

Referring now to FIGS. 6-8, each microslot matrix 60 may be defined by a plurality of individual microslots 65 that are positioned adjacent to each other. FIG. 6 depicts a top view of an exemplary individual microslot matrix 60. FIG. 7 depicts one individual microslot 65 in cross section. In the illustrated embodiment, the microslot matrix 60 comprises ten individual microslots 65. It should be understood that other embodiments may include more or fewer microslots in each microslot matrix 60. In the illustrated embodiment, each microslot 65 has a length 62, a width 64, and a depth 63. Modifying the dimensions of the microslot 65 may affect the amount of surface area created by each microslot 65. Each microslot further has a base 61 and edges 66. Each of the individual microslots 65 of the illustrated exemplary microslot matrix 60 is uniform and of linear geometry. In other embodiments, the microslots may be non-uniform and may have varying lengths, widths, depths, or edge geometry. The individual microslots also may have any geometry, such as straight, curved, wavy, or the like.

The edges 66 (i.e., walls) of each microslot 65 may have different shapes, such straight or chamfered as shown in FIG. 7. For example, rounded edges 66 may allow the coolant fluid 30 to flow in and out of the microslot 65 effectively. The depth 63 and general configuration of the microslots 65 increases the available surface area for heat transfer and phase change of the coolant fluid 30, which further improves heat transfer.

The microslots 65 may be formed directly on the target surface 50 by a variety of processes. For example, the microslots 65 may be machined with a grinding apparatus directly on the target surface 50, or a water jet machining process may be used. Laser machining may also be used to form the microslots 65. Laser machining may provide the finest detail and most precise dimensions for each microslot compared to other processes. Other processes may also be used.

FIG. 8 provides an exemplary alternative embodiment of a microslot matrix 88. While the microslot matrix 60 shown in FIG. 6 comprises uniform microslots 65, other embodiments may have non-uniform microslots that define an individual microslot matrix, such as the non-uniform microslot matrix 88 depicted in FIG. 8. The illustrated non-uniform microslot matrix 88 includes ten individual microslots. A first microslot 81 may have a length 83 and width 85, and may be positioned adjacent to a second microslot 82 having a different length 84 and width 86. The remainder of the non-uniform microslot matrix 88 may include additional microslots having the dimensions of the first microslot 81 or the second microslot 82, or microslots having still other dimensions. In addition, the microslots may have varying depths. Still further, the microslots may be curvilinear or have an arbitrary shape. Individual microslots of the microslot matrix may have different shapes. For example, some of the microslots may be curvilinear while others are linear and/or straight. The microslots may further have varying depths, for example a microslot may be deeper at the edges than the center or may be deeper on one edge than the other.

Upon impinging the target surface 50, the cooling fluid 30 reaches a localized boiling temperature at nucleation sites provided by the microslots 65 due to the high temperature of the heat generating device being cooled, and therefore phase change of the cooling fluid 30 occurs. Nucleation sites at the microslots may have a lower effective surface energy than other regions of the target surface 50. The rate of nucleation is dependent, among other factors, upon the number of potential nucleation sites, and accordingly, an increase in the number of potential nucleation sites on the target surface 50 may result in an increased rate of nucleation and therefore increased heat transfer. A target surface with limited nucleation sites may limit the thermal performance of the cooling apparatus 10. For example, a flat, non-porous target surface may have few nucleation sites, making nucleation inefficient for the impingement jets 32 and may prevent a high rate of nucleation across the target surface.

Due to the geometry and dimensions of the microslots 65, each microslot 65 provides additional surface area and nucleation sites for nucleation to occur. The nucleation sites may be located along the base 61 of each microslot 65. The base 61 of each individual microslot 65 may offer a lower effective surface energy and may provide a high density region of nucleation sites for the coolant fluid 30, aiding in two-phase thermal transfer. The microslots 65 may further guide the coolant fluid 30 to flow along the direction of the microslot 65, providing capillary assisted flow. Because of this feature, coolant fluid 30 can be directed to various areas of the target surface 50 depending on the orientation, angular configuration, and/or geometry of the individual microslots 65. Accordingly, the microslots 65 may improve thermal heat transfer by providing additional surface area and nucleation sites for the coolant fluid.

Modifying the dimensions of the microslots may affect the number of nucleation sites and the density of nucleation sites created by the individual microslots. For example, a longer microslot may create additional nucleation sites. Varying the depth of the microslots may also impact heat transfer and may affect the flow of coolant fluid into or away from the microslot. Further, modifying the placement of individual microslots within a microslot matrix may further adjust the heat transfer properties of the target surface. For example, microslots positioned at desired angles may assist in guiding coolant fluid in the angle of the microslot. Additionally, while the microslots shown herein are parallel to each other, in other embodiments the microslots may be transverse to each other. In other embodiments, the microslots may be, for example, arranged in a cross-hatch pattern or may be normal to each other.

Figure 9:
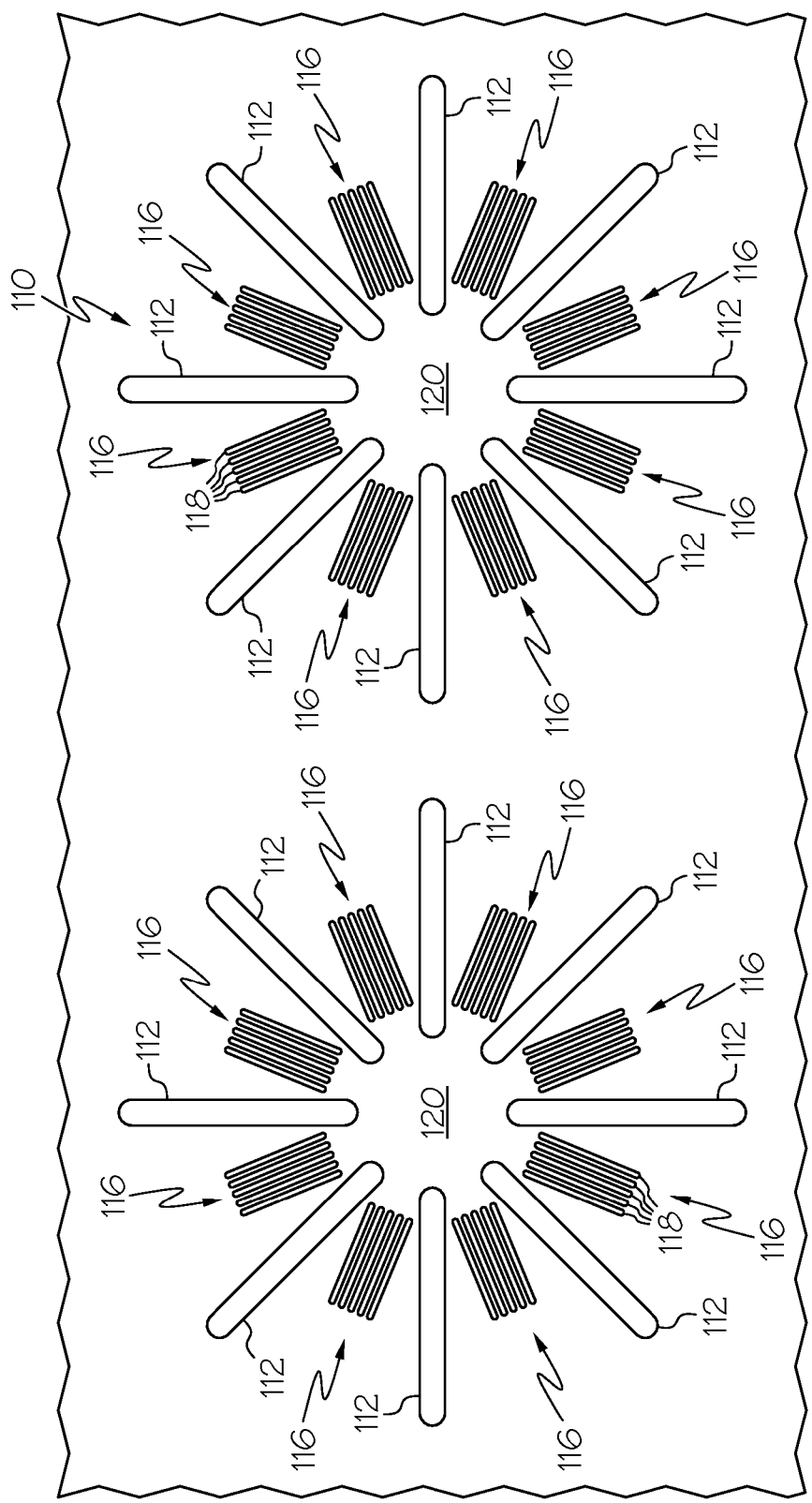
FIG. 9 schematically depicts a top view of a target surface having radial surface fins and microslots according to one or more embodiments described and illustrated herein.

Referring now to FIG. 9, an alternative embodiment of a target surface 110 comprising surface fins 112, microslot matrices 116, and jet impingement zones 120 is depicted. In the illustrated embodiment, the target surface 110 includes surface fins 112 that extend radially from each jet impingement zone 120. Between the surface fins 112 are microslot matrices 116 comprising individual microslots 118. Although shown with a single microslot matrix 116 between each pair of surface fins 112, additional microslot matrices 116 may be included, with additional microslot matrices 116 positioned adjacent to the illustrated microslot matrices 116. The surface fins 112 and microslots 118 in this embodiment of the target surface 110 may incorporate any of the above-discussed characteristics. For example, the surface fins 112 may be curvilinear and of different dimensions, while the individual microslots 118 may also be of different geometries and dimensions, and may also be uniform or non-uniform, as discussed above. This embodiment of the target surface 110 may provide additional surface area due to surface fins 112, as well as increased surface area and an increased number of nucleation sites due to microslot matrices 116. The surface fins 112 may also guide coolant as coolant impinges the target surface 110.

Embodiments of the present disclosure, such as the target surface 50 in FIG. 4, may increase the rate of nucleation and therefore the heat transfer of the cooling apparatus 10. By providing surface fins 52 and microslots 65 in microslot matrices 60, surface area is increased and additional nucleation sites are created, allowing for more effective heat transfer and boiling of the coolant fluid 30. The position of microslot matrices 60, as well as the features of individual microslots 65 may be selected based on the size of the target surface 50 and the location of jet impingement zones 70 and surface fins 52 on the target surface 50, as discussed herein. The enhanced heat transfer assembly 54 described herein having target surface 50 with surface fins 52 and microslot matrices 60 may be implemented into other cooling apparatuses. For example, the enhanced heat transfer assembly, although shown in isolation herein, may be implemented in other two-phase cooling apparatuses or heat transfer apparatus that utilize fluid flow thermodynamics.

EXAMPLES

An experiment was performed comparing the heat transfer of a two-phase heat transfer cooling apparatus using the enhanced heat transfer assembly including the microslot matrices described herein to the same two-phase heat transfer cooling apparatus without microslot matrices. A cooling apparatus with a target surface was operated and the amount of heat transferred from the heat generating device to the coolant fluid in the impingement chamber was measured over time. The same cooling apparatus was then modified to include the microslot matrices as shown in FIGS. 4 and 5 and the experiment was performed again. The amount of heat transferred over time was again measured.

Figure 10:
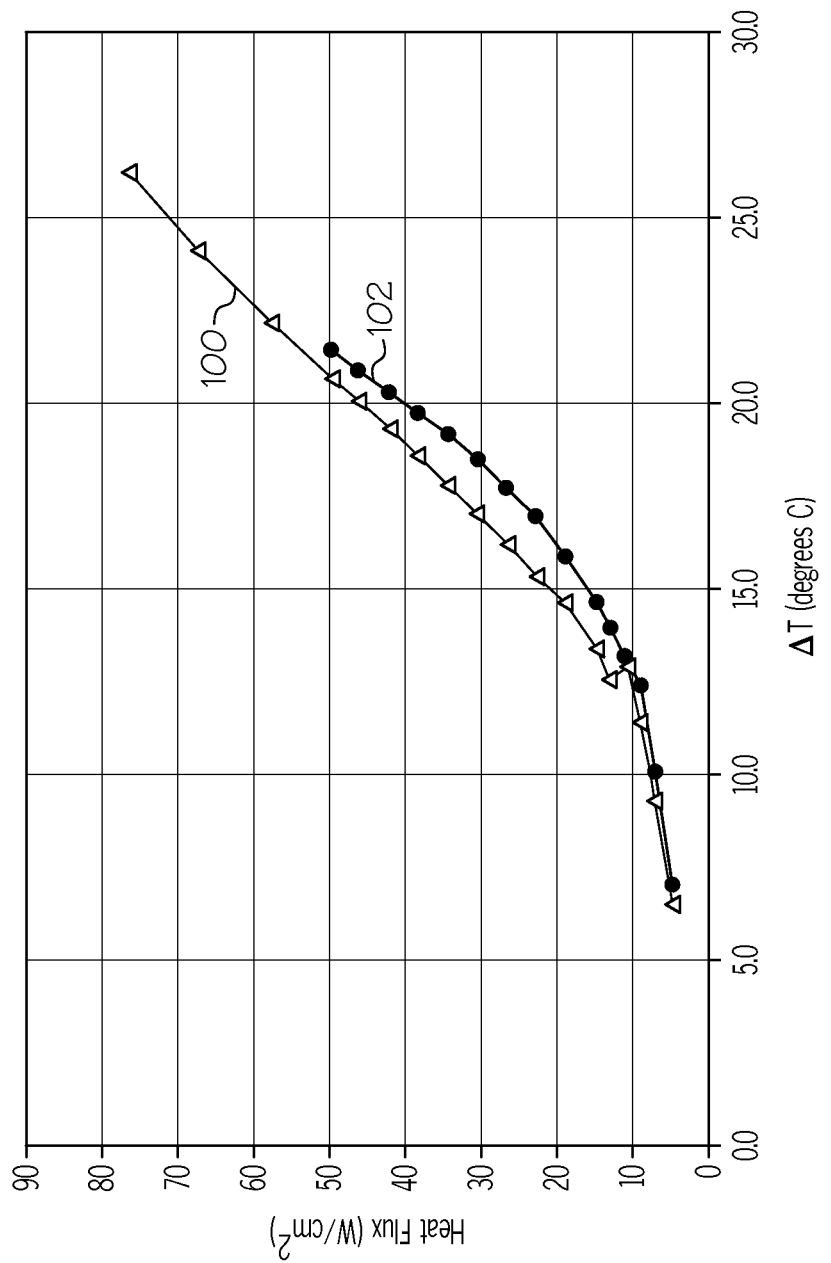
FIG. 10 graphically depicts heat transfer experimental test results using a heat transfer assembly according to one or more embodiments described and illustrated herein.

FIG. 10 displays the results of the experiment in a line graph, with heat flux of the device in Watts/cm$^2$ along the Y-axis and change in temperature between the heat generating device and the coolant fluid at the inlet in degrees Celsius along the X-axis. Both cooling apparatuses utilized target surfaces comprised of copper. Line 100 represents the experimental results of the cooling apparatus with the enhanced heat transfer assembly and line 102 represents the experimental results of the cooling apparatus without the enhanced heat transfer assembly described herein. As shown in the graph, the cooling apparatus with the enhanced heat transfer assembly and target surface including surface fins and microslots provided increased heat transfer. For example, the cooling apparatus with the enhanced heat transfer assembly had a heat flux of approximately 45 Watts/cm$^2$ with a change in temperature of approximately 20 degrees Celsius, while the cooling apparatus without the enhanced heat transfer assembly had a heat flux of approximately 40 Watts/cm$^2$ with a change in temperature of approximately 20 degrees Celsius. Thus, the heat transfer performance of the cooling apparatus with the enhanced heat transfer assembly was improved compared to the heat transfer performance of the cooling apparatus without the enhanced heat transfer assembly.

It should now be understood that embodiments described herein are directed to jet impingement cooling apparatuses having target surfaces with surface fins and microslots for enhanced thermal performance. The microslots provide additional nucleation sites and increased surface area for effective and efficient heat transfer from a heat generating device to coolant fluid.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An enhanced heat transfer assembly comprising:
a target surface;
a plurality of surface fins extending from the target surface; and
a plurality of microslot matrices formed on the target surface wherein:
each microslot matrix comprises individual microslots positioned adjacent to each other, and
each microslot matrix is adjacent to a jet impingement zone and at least one of the plurality of surface fins.

2. The enhanced heat transfer assembly of claim 1, wherein the individual microslots have a uniform length, a uniform width, and a uniform depth.

3. The enhanced heat transfer assembly of claim 1, wherein the individual microslots are non-uniform.

4. The enhanced heat transfer assembly of claim 1, wherein the individual microslots are linear.

5. The enhanced heat transfer assembly of claim 1, wherein the individual microslots are substantially parallel to the plurality of surface fins.

6. The enhanced heat transfer assembly of claim 1, wherein the plurality of surface fins is defined by straight surface fins arranged in a radial configuration around the jet impingement zone.

7. The enhanced heat transfer assembly of claim 1, wherein the target surface is comprised of copper or aluminum.

8. A cooling apparatus comprising:
a fluid inlet channel;
a fluid outlet channel;
a jet orifice surface comprising a plurality of jet orifices fluidly coupled to the fluid inlet channel such that coolant fluid within the fluid inlet channel is capable of flowing through the plurality of jet orifices as a plurality of impingement jets; and
an enhanced heat transfer assembly with a target surface, wherein:
the target surface comprises a plurality of surface fins, a plurality of microslot matrices comprising individual microslots, and a plurality of jet impingement zones on the target surface, wherein each individual microslot matrix is separated by at least one of the plurality of jet impingement zones and individual matrices and individual jet impingement zones are disposed between adjacent surface fins, and
the target surface and the jet orifice surface define an impingement chamber, and the plurality of impingement jets are substantially aligned with the plurality of jet impingement zones.

9. The cooling apparatus of claim 8, wherein the individual microslots have a uniform length, a uniform width, and a uniform depth.

10. The cooling apparatus of claim 8, wherein the individual microslots are non-uniform.

11. The cooling apparatus of claim 8, wherein the individual microslots are linear.

12. The cooling apparatus of claim 8, wherein the individual microslots are substantially parallel to the plurality of surface fins.

13. The cooling apparatus of claim 8, wherein the plurality of surface fins is defined by straight surface fins arranged in a radial configuration around individual ones of the plurality of jet impingement zones.

14. The cooling apparatus of claim 8, wherein the target surface is comprised of copper or aluminum.

15. A power electronics module comprising:
a fluid inlet channel;
a fluid outlet channel;
a jet orifice surface comprising a plurality of jet orifices fluidly coupled to the fluid inlet channel such that coolant fluid within the fluid inlet channel is capable of flowing through the plurality of jet orifices as a plurality of impingement jets;
a heat transfer assembly comprising a target surface and a heat transfer surface;
a power electronics device thermally coupled to the heat transfer surface of the heat transfer assembly, wherein:
the target surface comprises a plurality of surface fins, a plurality of microslot matrices comprising individual microslots, and a plurality of jet impingement zones on the target surface, wherein each individual microslot matrix is separated by at least one of the plurality of jet impingement zones and individual matrices and individual jet impingement zones are disposed between adjacent surface fins, and
the target surface and the jet orifice surface define an impingement chamber, and the plurality of impingement jets are substantially aligned with the plurality of jet impingement zones.

16. The power electronics module of claim 15, wherein the individual microslots have a uniform length, a uniform width, and a uniform depth.

17. The power electronics module of claim 15, wherein the individual microslots are non-uniform.

18. The power electronics module of claim 15, wherein the individual microslots are substantially parallel to the plurality of surface fins.

19. The power electronics module of claim 15, wherein the plurality of surface fins is defined by straight surface fins arranged in a radial configuration around individual ones of the plurality of jet impingement zones.

20. The power electronics module of claim 15, wherein the target surface is comprised of copper or aluminum.

* * * * *

UNITED STATES PATENT AND TRADEMARK OFFICE
CERTIFICATE OF CORRECTION

PATENT NO. : 9,131,631 B2  
APPLICATION NO. : 13/962303  
DATED : September 8, 2015  
INVENTOR(S) : Shailesh N. Joshi It is certified that error appears in the above-identified patent and that said Letters Patent is hereby corrected as shown below:

In The Specification  
In Column 1, Line 17, delete "," and insert --.--, therefor.  
In Column 3, Line 6, insert --,-- after "vapor".  
In Column 3, Line 52, delete "," after "the fluid".  
In Column 4, Line 37, delete "," after "field".  
In Column 5, Line 10, delete "tins" and insert --fins--, therefor.  
In Column 5, Line 36, delete "," after "being".  
In Column 5, Line 54, insert --(e.g.,-- after "microslots".

Signed and Sealed this  
First Day of March, 2016

Michelle K. Lee  
*Director of the United States Patent and Trademark Office*